(12) United States Patent
Edelen (10) Patent No.: US 7,462,513 B2
(45) Date of Patent: Dec. 9, 2008

(54) METHODS FOR MAKING PRINTED FUSE DEVICES

(75) Inventor: John G. Edelen, Versailles, KY (US)

(73) Assignee: Lexmark International, Inc., Lexington, KY (US)

( * ) Notice: Subject to any disclaimer, the term of this patent is extended or adjusted under 35 U.S.C. 154(b) by 184 days.

(21) Appl. No.: 11/208,699

(22) Filed: Aug. 22, 2005

(65) Prior Publication Data

US 2007/0042515 A1 Feb. 22, 2007

(51) Int. Cl.
*H01L 21/82* (2006.01)

(52) U.S. Cl. .................. 438/132; 438/601; 438/674; 257/E23.149; 365/96

(58) Field of Classification Search ............... 438/132, 438/601, 674; 365/96; 347/1
See application file for complete search history.

(56) References Cited

U.S. PATENT DOCUMENTS

| | | | | |
|---|---|---|---|---|
| 4,647,340 A | * | 3/1987 | Szluk et al. | 438/281 |
| 4,814,853 A | * | 3/1989 | Uchida | 257/530 |
| 4,910,418 A | * | 3/1990 | Graham et al. | 326/38 |
| 6,384,708 B1 | * | 5/2002 | Jollenbeck et al. | 337/297 |
| 6,384,727 B1 | | 5/2002 | Diprizio et al. | |
| 6,479,308 B1 | * | 11/2002 | Eldridge | 438/14 |
| 6,503,831 B2 | * | 1/2003 | Speakman | 438/674 |
| 6,686,211 B1 | | 2/2004 | Asakawa | |
| 6,713,389 B2 | | 3/2004 | Speakman | |
| 6,864,123 B2 | | 3/2005 | Shimoda | |
| 7,198,885 B2 | * | 4/2007 | Kawase | 430/313 |
| 2002/0191434 A1 | * | 12/2002 | Taussing et al. | 365/105 |
| 2004/0209404 A1 | | 10/2004 | Wang et al. | |
| 2005/0045375 A1 | | 3/2005 | Carlson et al. | |
| 2005/0073386 A1 | * | 4/2005 | Goto et al. | 336/223 |

(Continued)

FOREIGN PATENT DOCUMENTS

EP 1329488 7/2003

(Continued)

OTHER PUBLICATIONS

Calvert, Paul, Inkjet Printing for Materials and Devices, Chem. Mater. 2001, vol. 13, No. 10, pp. 3299-3305, American Chemical Society.

(Continued)

*Primary Examiner*—Douglas M. Menz
*Assistant Examiner*—Steven J. Fulk
(74) *Attorney, Agent, or Firm*—Dinsmore & Shohl LLP (57) ABSTRACT

Embodiments of the invention relate to efficient formation of improved fuses and fuse arrays, such as can be used in memory devices for example, by use of a printer that transfers material to a flexible substrate. In one embodiment, a fuse is printed using an inkjet printer on a flexible substrate fed therethrough, by depositing droplets of conductive material. The droplets form a weak portion and one or more main portions. In one embodiment, the fuse may comprise a single metal material. In additional embodiments, an array of fuses can be printed by an inkjet printer in layers for use as digital memory. For example, a layer can be printed that forms fuse elements and word address conductors, an insulating layer can be printed over the fuses but leaving a window portion exposed, and a third layer can be printed over the window portions to provide bit address conductors.

17 Claims, 5 Drawing Sheets

U.S. PATENT DOCUMENTS

2006/0098485 A1* 5/2006 Leenders et al. ....... 365/185.12

FOREIGN PATENT DOCUMENTS

| JP | 08236902 | 9/1996 |
|---|---|---|
| JP | 2004165310 | 6/2004 |

OTHER PUBLICATIONS

Calvert et al., Paul, Multilayer Inkjet Printing of Biopolymers, OLED's and Other Devices, www.aml.arizona.edu/~calvert/papers/calvertimaps.pdf, date unknown.

Molesa et al., Steven E., A High-Performance All-Inkjetted Organic Transistor Technology, 2004 IEEE International Electron Device Meeting Technical Digest, 2004, p. 1072, IEEE.

Molesa et al., Steven, High-Quality Inkjet-Printed Multilevel Interconnects and Inductive Components on Plastic for Ultra-Low-Cost RFID Applications, Mat. Res. Soc. Symp. Proc., vol. 769, 2003, H8.3.1-H8.3.6, Materials Research Society.

Customer & Collaborator Publications, listed at www.microfab.com/about/customer_papers.pdf, 2004, MicroFab Technologies, Inc.

Burns et al., Seamus E., Abstract of Inkjet Printing of Polymer Thin-Film Transistor Circuits, MRS Bulletin, Nov. 2003, vol. 28, No. 11, Materials Research Society.

Various Abstracts from Program, Inkjet Printing of Functional Polymers and Materials, www.schubert-group.de/COMBIMAT/Program%20workshop.pdf, Jun. 2004, Dutch Polymer Inst.

Various Topics, e-newsletter, Feb. 2005, vol. 2, Issue 1, Georgia Institute of Technology Packaging Research Center, www.prc.gatech.edu/newsletter/feb2005.htm.

* cited by examiner

METHODS FOR MAKING PRINTED FUSE DEVICES

TECHNICAL FIELD

The present invention relates generally to fuses, and more particularly to printed fuse devices and methods for making the same.

BACKGROUND

Through standard semiconductor processing, a variety of electronic devices can be manufactured, such as transistors and the like. Such processing can require steps such as masking, etching, dopant diffusion, and deposition. Accordingly, such processing can be complex and require expensive equipment.

While less expensive techniques have been developed, such as printing of semiconductor materials and devices, it can be difficult to utilize such techniques to manufacture viable memory devices. In particular, solid state memory devices often use floating gate transistors as the basic memory elements. Such elements require sufficient carrier mobility to allow for electron transport through a dielectric layer into the floating gate layer. Carrier mobility of printed semiconductor material, however, is relatively low, making it generally unsuitable for manufacture of floating gate transistors for use in memory devices.

One type of memory device is a programmable read only memory (PROM) device. To render them programmable, PROM devices are typically provided with an electrical connection in the form of a fusible link (fuse). To open the fuse, a relatively high electrical current is driven though the metal or polysilicon layer. The current heats the metal or polysilicon above its melting point, thereby breaking the conductive link and making the metal layer or polysilicon discontinuous. The PROM device is thus programmed via conducting and non-conducting patterns of fuses, which represent the logical 1's and logical 0's corresponding to the data to be stored in the memory device.

Conventional semiconductor methods can be utilized for manufacture of such a fuse for a memory device. For example, in one method disclosed in US 20040209404, a semiconductor fuse is manufactured by providing an insulating substrate, forming a titanium nitride layer over the insulating substrate, and forming a tungsten silicide layer over the titanium nitride layer. In this method, these layers are formed as follows: the insulating substrate is formed by thermally oxidizing a portion of a silicon substrate, the titanium nitride layer is formed by depositing a layer of titanium and annealing the titanium in an atmosphere containing nitrogen or by depositing a layer of titanium in an atmosphere containing nitrogen, and the tungsten silicide layer is formed by chemical vapor deposition. In addition, the tungsten silicide layer is patterned by a photolithographic pattern and etch process and the titanium nitride layer is patterned by a wet etch process using the patterned tungsten silicide layer as a hard mask. However, these and other manufacturing techniques can be difficult to implement and require complex and expensive equipment.

Accordingly, it is desirable to reduce the expense and difficulty in manufacturing fuse devices, memory devices, and related circuitry. It is also desirable to provide less expensive, reliable fuse elements, memory devices, and related circuitry.

SUMMARY

According to one aspect, a method of forming a memory element is provided, comprising inkjet printing material to form a fuse element. The inkjet printing operation may comprise inkjet printing conductive material at a first dimension to form a main portion, and inkjet printing conductive material at a second dimension to form a weak portion, the second dimension being less than the first dimension. The first and second dimensions are configured such that application of a predetermined current through the main portion and weak portion will cause the weak portion to become discontinuous while the main portion remains continuous upon application of the predetermined current.

According to another aspect, a circuit element is provided. The element is formed by the process of using a printer to transfer small portions (e.g., droplets) of a conductive material (e.g., a metal material) to form a fuse, wherein the portions form a weaker portion that becomes non-conductive when a predetermined current is applied to it.

In accordance with another aspect, a method of forming an array is provided. The method comprises using a printer to form a first layer comprising conductive material that is configured to act as a first fuse, and using a printer to form a second layer comprising dielectric material over the first layer. The method further comprises using a printer to form a third layer comprising conductive material that is configured to act as a second fuse and is deposited over the second layer. The layers form a three dimensional array of fuses.

According to another aspect, a method of forming a fuse device is provided comprising using a printer to deposit a conductive material that is configured to act as a first fuse having a contact portion, and using a printer to deposit a dielectric material over the first fuse. The dielectric material includes an opening that resides over the contact portion of the first fuse. The method further comprises using a printer to deposit a conductive material that is configured to act as a first conductor and is deposited over the dielectric material and the opening and in electrical contact with the contact portion of the first fuse.

Additional aspects of the present invention will become apparent to those skilled in this art from the following description wherein there is shown and described embodiments of the invention, solely for the purposes of illustration and example. As will be realized, other different aspects and embodiments can be provided without departing from the scope of the invention. Accordingly, the drawings and descriptions herein are illustrative in nature and not restrictive in nature.

BRIEF DESCRIPTION OF THE DRAWINGS

While the specification concludes with claims particularly pointing out and distinctly claiming the present invention, it is believed the same will be better understood from the following description taken in conjunction with the accompanying drawings wherein like numerals indicate corresponding elements and wherein:

DETAILED DESCRIPTION OF ILLUSTRATIVE EMBODIMENTS

Generally, embodiments of the invention relate to efficient formation of accurate fuses and fuse arrays, such as can be used in memory devices for example, by use of a printer that transfers material to a flexible substrate. In one embodiment, a fuse is printed using an inkjet printer on a flexible substrate fed through the printer, by depositing droplets of conductive material. The droplets form a weak portion and one or more main portions, the weak portion being configured such that application of a predetermined current through the fuse causes the weak portion to become non-conductive, such as by becoming discontinuous via migration and thermal melting of the material. In one embodiment, the fuse may comprise a single metal material. In additional embodiments, an array of fuses can be printed by a printer, such as an inkjet printer, in layers. For example, a first layer can be printed that forms fuse elements and word address conductors, a second layer can be printed over the fuses to insulate a portion of the fuse while leaving a window portion exposed, and a third layer can be printed over the window portions to provide bit address conductors. The programming or "writing" of the array can then occur by the selective application of voltages to the word and bit conductors, causing appropriate fuses to blow or be made non-conductive due to the presence of the predetermined current level. When reading the array, lower voltages can be applied to the address conductors and the presence or absence of current flow through each fuse will indicate a logical 1 or a logical 0, thereby representing data for use by a digital device.

Figure 1:
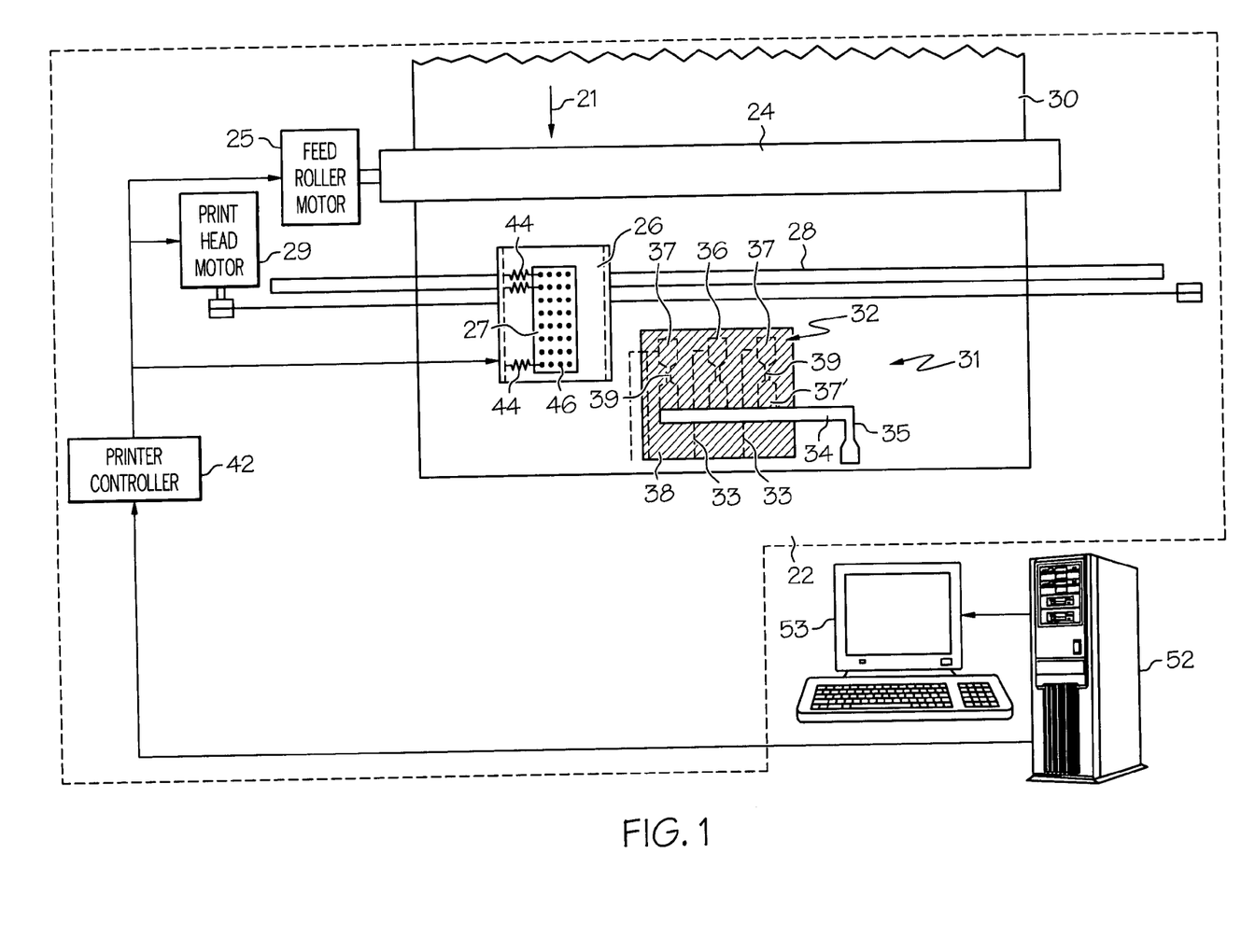
FIG. 1 is a schematic diagram illustrating an embodiment of a printer system configured to print a fuse array by depositing droplets of materials on a flexible substrate, the system being made and operating according to one or more of the inventive principles.

FIG. 1 is a schematic diagram illustrating an embodiment of a printer 22 configured to print a fuse array by depositing droplets of materials on a flexible substrate 30, the system being made and operating according to one or more of the inventive principles. The printer 22 includes mechanical and electrical systems for depositing a printing substance, such as ink, toner, or the like, onto a print receiving medium, such as paper, transparencies, flexible plastic, flexible polymer, or other media. Accordingly, the printer 22 may comprise an ink jet printer, a laser printer, a plotter, a multi-function apparatus incorporating any of the aforementioned devices, or other marking device that transfers material to a flexible substrate, and therefore may include any of a variety of components needed or desired for such printing purposes. Thus, the printer may be the same or similar to commercial or consumer printers used for printing text, graphics, photos, and the like. In this embodiment the printer comprises an ink jet printer where droplets of material are transferred to the substrate.

The printer 22 of this embodiment includes a media indexing system for advancing or indexing the print receiving media in the direction of arrow 21 such that the printing substance may be deposited on the media as the media is moved through the printer. The media indexing system of this embodiment includes a feedroller 24 driven by a motor 25. Accordingly, the print receiving medium can be fed into a nip between the feedroller 24 and a backup roller, whereby the medium is placed in contact with the feedroller by the backup roller to allow the medium to be driven by the outer surface of the roller 24.

The feedroller 24 may be driven by a suitable actuator, such as drive motor 25 which may comprise a DC servomotor or a stepper motor. The motor 25 can be directly coupled to the feedroller 24 or it can be coupled via a suitable gear system or transmission system. The motor 25 can be controlled by a controller 42 which can include appropriate motor drive circuitry, processing circuitry, and logic circuitry.

The printer 22 also includes a printhead assembly 26 which includes a printhead 27 movable along a carriage 28 under the power of a printhead motor 29 which is coupled to the printhead assembly 26 and controlled by controller 42. Printhead 27 includes nozzles 46 or other openings for allowing the printing substance to be deposited on the media as the media is advanced past the printhead assembly 26. The lateral movement of the printhead assembly under the power of the motor 29 in combination with the longitudinal movement of the media by the indexing system allows for the incremental printing of patterns or configurations forming circuit devices and/or text at various locations on the medium. However, other components than the illustrative components shown may be utilized for advancement of the media and application of the print substance. In this illustrative embodiment, the printhead assembly 26 and motor 29 may comprise typical components utilized in an ink jet printer.

The controller 42 in this illustrative embodiment controls the feedroller motor 25 in order to advance the print medium through the printer by corresponding movement of the feedroller 24. In addition, the controller also controls the printhead motor 29 in order to move the printhead assembly 26 across the media. The resulting longitudinal movement of the medium and lateral movement of printhead allow for the application of the printing substance at any location on the medium.

The controller 42 (or a separate controller) controls the firing of the various nozzles in the printhead 27 to cause the ink (and/or ink-like or printable material) to be applied to the medium 30 during this controlled movement of the print head assembly 26 and the print medium via roller 24, such as in an ink jet printing process. The controller 42 may comprise any appropriate circuitry, processor(s), integrated circuits, firmware, memory, and/or software for performing such control. In this example, the printer 22 is a thermal ink jet printer, where the controller 42 controls the firing of the nozzles 46 by selectively controlling the application of current through resistors 44, or other heating elements, which are associated with the nozzles 46. When current flows through a selected resistor 44, the printing material in a chamber near the associated nozzle 46 is heated to form a bubble, the formation of which causes a droplet to be ejected from the nozzle 46 onto the medium 30.

As shown in this example, the components 31 being printed by the printer 22 comprise fuse elements 32. In this example, the fuse elements 32 form an addressable array, where each fuse can be written and read by application of appropriate voltages to the word address conductor lines 33 and the bit address conductor lines 35. In addition, each fuse element in this example includes one more main portions (e.g., two end portions 37) and a weaker portion connected thereto (e.g., narrower middle portion 39 formed between ends 37). As will be described in further detail below, this configuration and the dimensions of these portions are such that a predetermined current level will cause the material of the narrower portion 39 to migrate and open the electrical connection of the fuse 32, such as by making the path discontinuous. The current may be applied to selective fuses 32 using the word and bit address conductors 33 and 35. In this way, individual fuses can be written as desired, to correspond to a series of bits which represent data.

As will be described in further detail below, in order to form the fuses 32, the printer can first apply conductive material as a bottom layer 36 on media 30, the bottom layer being shown in dashed lines on FIG. 1 to indicate it is the underlying layer. This material 36 can comprise a metal material or a composite material, such as silver, gold, or copper for example, and in some embodiments comprises a material having a conductivity of from about 0.02 ohms to about 0.6 ohms. The material can be in liquid form and held in a chamber in the printhead assembly 26 or fed to the printhead assembly, heated in the chambers by the heating elements 44, and ejected onto the flexible medium 30 via the nozzles 46, under control of the controller 42. If desired, a heating assembly can be provided to keep the material in a substantially liquid form.

The flexible medium 30 can comprise a paper material, polymer, polyester, or polyimide, or other material of low conductivity relative to the first layer of material 36. Once the first material 36 has cooled to form a fuse 32 and address lines 33, a second material, shown as block 38 in FIG. 1, can be applied over the first material using the printer 22. This second material 38 can comprise a dielectric material, such as 2 part epoxy, or other material of negligible conductivity. As with the first material 36, this material 38 can be applied by the ink jet process by heating the material in liquid form using the heaters 44, and thereby ejecting droplets of the material through the nozzles 46 onto the medium 30 at the locations dictated by the controller 42. The dielectric material can be applied in the desired pattern to cover the material 36 and to insulate the material at the desired locations from another layer of material to be applied. In this manner, another material can be applied to the medium 30, so as to reduce the space required for adding additional conductors and/or components and to allow for the circuit to be developed in three dimensions. In this example, a window portion is left near the end portion 37' of the fuse 32 wherein no dielectric is printed by the printer 22. The window portion allows a portion of the fuse to be exposed, allowing for a connection, terminal, or contact portion, such that the third material 34 can be applied to that portion and can connect to the fuse 32.

In particular, after printing of the second material 38 with its open window portions, the third material 34 is then printed over the first and second materials 36/38 using the printer 22 by ejecting droplets of the third material from the nozzles 46 under control of the controller 42 and heaters 44. The third material 34 can comprise a metal material, such as the same or similar material to the first material 36, or can comprise a composite material. Materials that can be utilized for the third material 34 include silver, gold, and copper. The third material 34 can have a high conductivity similar to that of the first material such that, when it makes contact with the first material 36 at the window locations, it provides an electrical path. Accordingly, the third material 34 can be configured by the printer 22 in the form of bit address conductors 35 which, in combination with the word conductors 33, allow the array to be written, read, and otherwise addressed on an individual fuse basis. The layers of materials 34, 36, and 38 allow the array to conserve space by building the circuitry in multiple layers in a third dimension, yet allowing only selective contact of the first and third layers by use of the middle dielectric layer and its windows.

As shown in the example of FIG. 1, a computer system can be utilized to design the layout of the fuses and to command the printer 22 to carry out the desired design. The computer system may include a processing system 52 and a display system 53. The processing system 52 can execute software for indicating where the fuses 32 and address lines 33/35 are to be located and how they are to be printed. For example, the software can be used to indicate the number of fuses, the location of the fuses, layers that should be printed over the fuses, the location of the address lines, etc. The software can then generate corresponding commands/print data which are supplied to the printer controller 42 over a data connection. The controller 42 then uses the commands, executes any needed conversion of data, and provides commands to the print head 26 and motors 25 and 29 to carry out the desired printing of the layers of materials 34/36/38 to form conductor lines 35, dielectric 38, and fuses 32 with coplanar conductor lines 33.

Although FIG. 1 shows an example of printer configurations that may be utilized to perform such printing of fuses, fuse arrays, and memory devices, other illustrative embodiments of such circuitry and other components can be used for conducting such printing. For instance, examples of such circuitry and components can be found in U.S. Pat. No. 6,431,677, the entire disclosure of which is hereby incorporated herein by reference.

Figure 2:
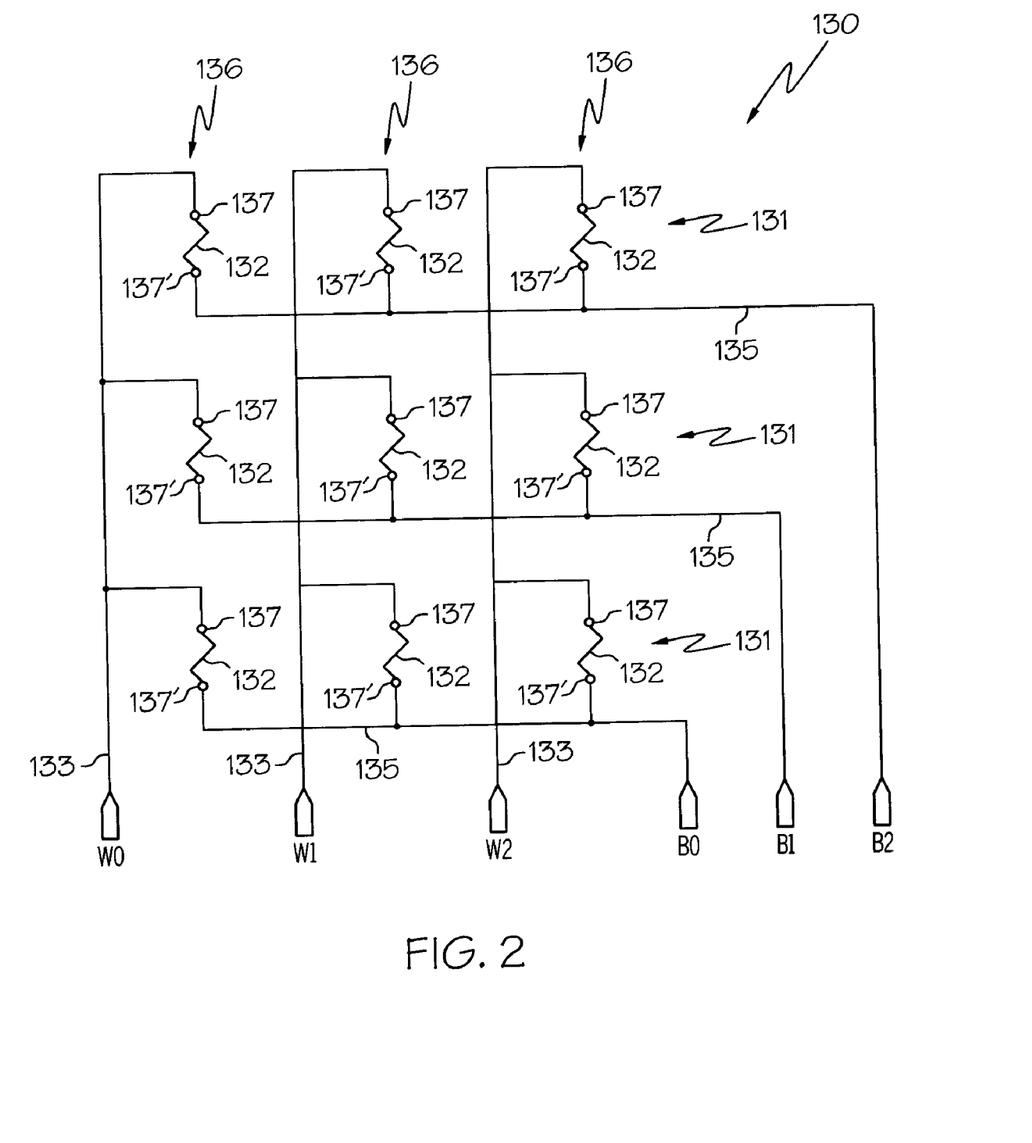
FIG. 2 is a circuit diagram showing an illustrative fuse array that can be printed using the system of FIG. 1 or a similar system.

FIG. 2 is a circuit diagram showing an illustrative fuse array 130 that can be printed using the system of FIG. 1 or a similar system. In this example, the array is formed by providing columns 136 of fuses 132. Each fuse 132 in each column 136 is connected at its first end 137 to a common word address conductor 133. The fuses 132 are also provided in rows 131. Each fuse 132 in each row 131 is connected at its second end 137' to a common bit address conductor 135. The address conductors 135 and 133 terminate in terminals or pins (W0-Wn, B0 to Bn). Accordingly, each fuse can be individually addressed (e.g., read or written) by applying the appropriate voltages to the appropriate word and bit conductors. For example, to program or open fuse W0B0 (the fuse at the bottom of the left column), a high voltage can be placed on the W0 pin while 0 volts (e.g., ground, return) is applied to the B0 pin. This causes a high current to flow through the W0B0 fuse. For instance, for a fuse made of silver, a voltage of 2.5V could be applied to pin W0 and a low voltage applied to pin B0, causing a predetermined current of about 5A to be applied. The fuse was printed with a weaker portion relative to this predetermined current flow (e.g., a narrower, thinner, or less dense portion, or a portion having different properties, etc.) If the current density is at this level, the weaker portion will open, breaking the electrical connection. For a fuse having a weaker portion formed as a neck as in the example of FIG. 1, this breaking can occur by the migration and thermal melting of metal in the presence of the predetermined current. Accordingly, after opening, the fuse will therefore become part of an open circuit. This can be repeated for selectively opening other fuses, and the open fuses can then represent one logical level with the other closed fuses representing another logical level (e.g., 1's and 0's). The appropriate fuses can be written in this manner to represent the appropriate sequence of data bits.

After writing or programming the desired fuses in this manner, to read the state of the fuse, a low voltage can be placed on the appropriate word pin and 0 volts applied to the bit pins. For example, to read fuse W0B0, a low voltage can be applied to pin W0 and 0 volts applied to pin B0. The low voltage may be in the range of about 0.5V to 25 mV volts for example. A current sensor can be supplied and connected with each bit pin. If the sensor senses a current after these reading voltages have been applied, then the fuse is closed and considered to be in a first logical state. If the sensor does not sense a current, then the fuse is open and considered to be in a second logical state. These voltages can be applied to all of the word and bit pins to sense the states of all of the fuses 132 in the array 130, to thereby obtain all of the data represented by these fuses. Although current sensors may be utilized, other sensors can be utilized and other electrical parameters of the fuse can be sensed in order to read out the fuse conditions.

Figure 3:
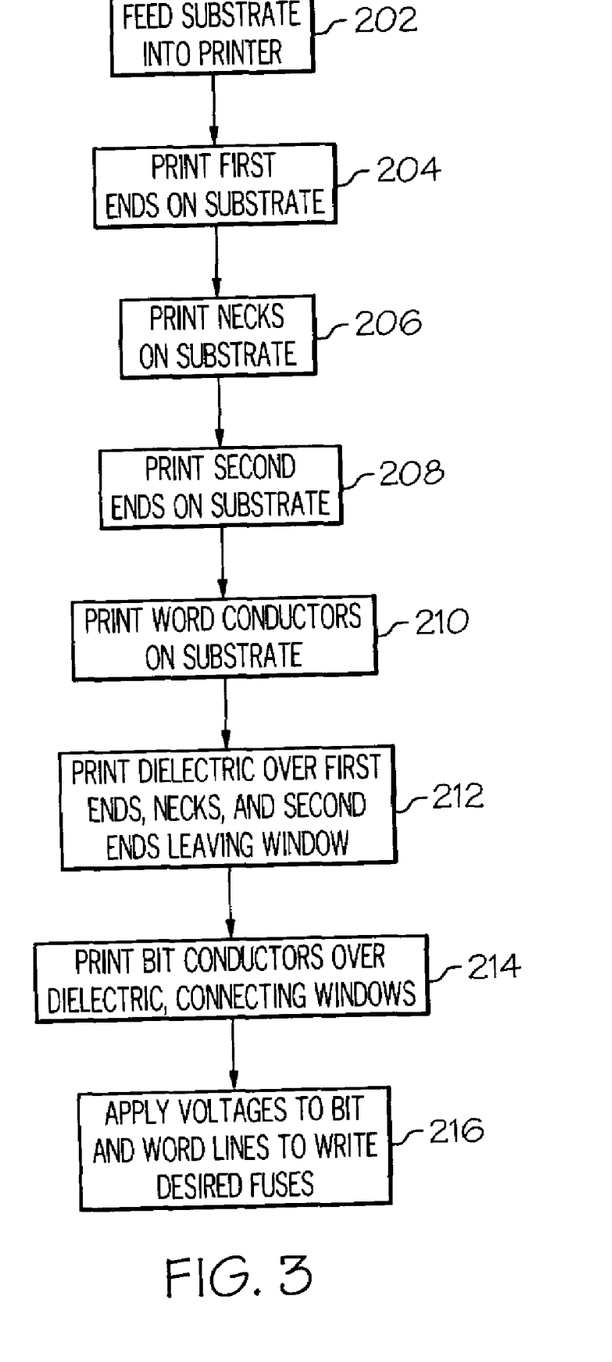
FIG. 3 is a flow diagram showing an illustrative method for printing a fuse array using a printer, according to one or more of the inventive principles.
Figure 4A:
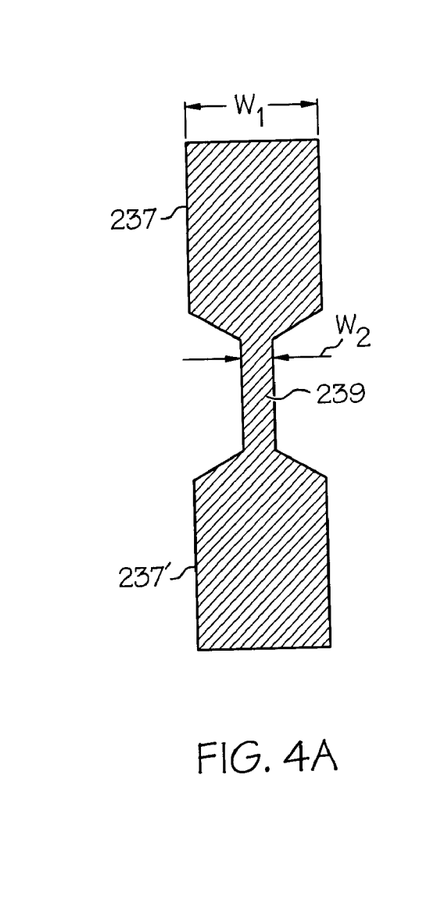
FIGS. 4A-4C are plan view schematic diagrams showing an illustrative fuse as it is being printed by a printer in various stages and layers, according to one or more of the inventive principles.

FIG. 3 is a flow diagram showing an illustrative method for printing a fuse array using a printer, according to one or more of the inventive principles. According to this example, a substrate is fed into a printer as shown at block 202. The first ends of the fuse are printed on the substrate, as shown at block 204. FIG. 4a shows an example of a first end portion 237 that can be printed using this method.

In this example, the weaker portions of the fuses are to comprise less wide portions that form necks. Accordingly, at block 206, necks are printed on the substrate connecting with the first ends. Example neck portions 239 are shown in FIG. 4a. These neck portions 239 have a width W2 that is less than the width W1 of the first end 237. For example, the neck portion 239 could have a width in the range of 50 to 5 um, while the end portion 237 could have a width in the range of 200 to 20 um, such that the ratio of the width of the end portion to that of the neck portion is in the range of 4:1 to 40:1. For instance, the neck portion 239 could be 25 um wide while the end portion could be 100 um wide. With this configuration, current density in the neck area would be 4 times that in the end portions, ensuring that electromigration and thermal melting will occur in the neck area 239 first. Using such a configuration with 100 um spacing between address conductors, fuses could be printed with a density of 4 fuses per $mm^2$. With such a density, a credit card sized substrate (e.g., 2⅛"× 3⅜") could accommodate a 160 word by 110 bit array, for a total of 17,600 bits.

With reference again to the example of FIG. 3, the second ends of the fuse are also printed on the substrate, as shown at block 208, such that they will be connecting with the neck. As shown in FIG. 4a, the second ends 237' can likewise have a width that is greater than that of the neck portion 239. This width can be the same as the width of the first end portion 237.

In addition, word conductors can be printed on the substrate, as shown at block 210 of FIG. 3. These conductors can connect with the fuses to provide addressing capability. The word conductors and the fuse portions can all be printed using the same metal material and on the same plane. The material can be one of those discussed above, or another material capable of being processed by an ink jet printer and deposited in droplets, like ink, on the substrate.

Figure 4B:
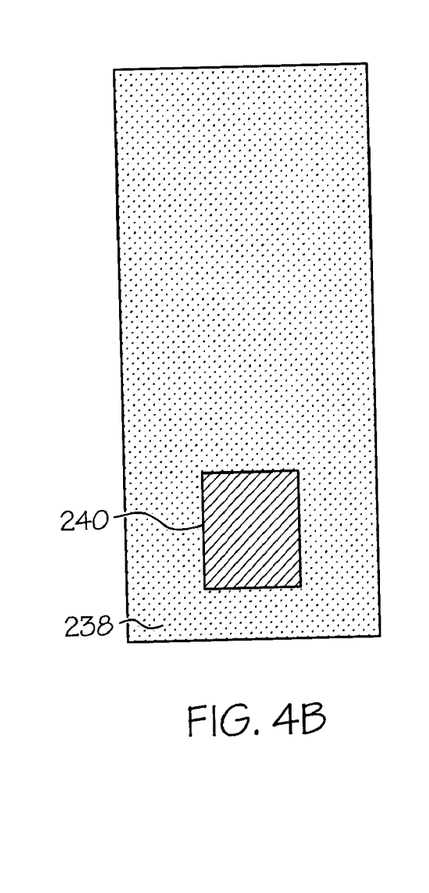

At block 212 of this illustrative method, a dielectric is printed over the first ends, necks and second ends. However, the dielectric is not printed over at least a portion of the second end, leaving an open window (an area not printed with dielectric), through which the fuse may be accessed. In the example of FIG. 4B, the dielectric layer 238 is shown as the dotted area and includes a Window area 240 where dielectric is not printed and a portion of the second end 237' of the fuse is viewable. The dielectric material can be one of those discussed above, or other dielectric material capable of being printed using ink jet technology.

Figure 4C:
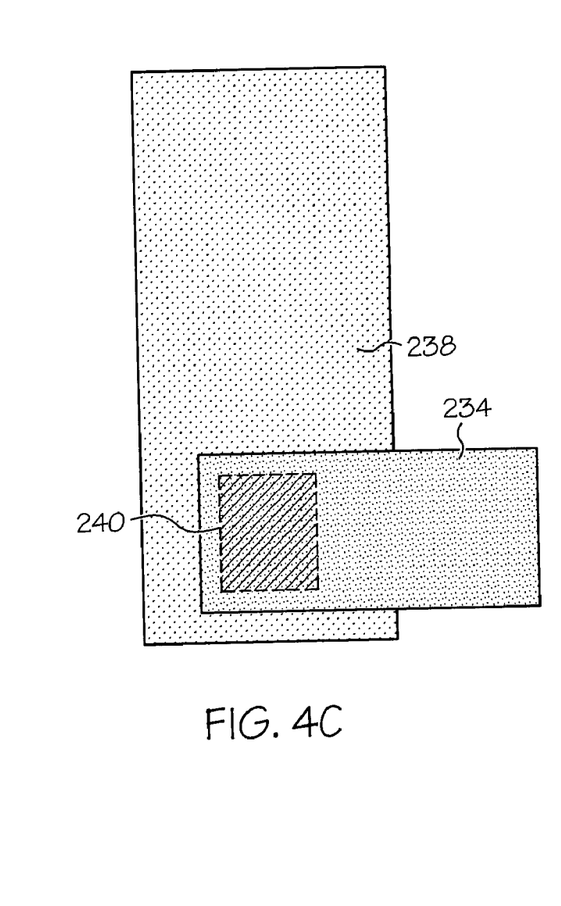

Returning again to FIG. 3, bit conductors can then be printed over the dielectric, and particularly over the windows of the fuses printed, to allow the fuses to be addressed, as shown at block 214. In the example of FIG. 4C, the bit conductors comprise a third layer of material 234 printed over the dielectric 238 and the window 240. The material 234 can be one of those discussed above, or other material suitable for printing.

Once the fuses and conductors are printed, voltages can be applied to the bit and word conductors to selectively program or write the desired fuses, as shown at block 216 of FIG. 3. Application of the appropriate voltages (e.g., voltage differentials) can cause the weaker portion (e.g., a neck) of the desired fuses to become discontinuous such that current cannot flow through the fuse. The fuses to which this voltage has been applied can then represent a first logical state while the fuses to which the voltage has not been applied can represent a second logical state.

Figure 5:
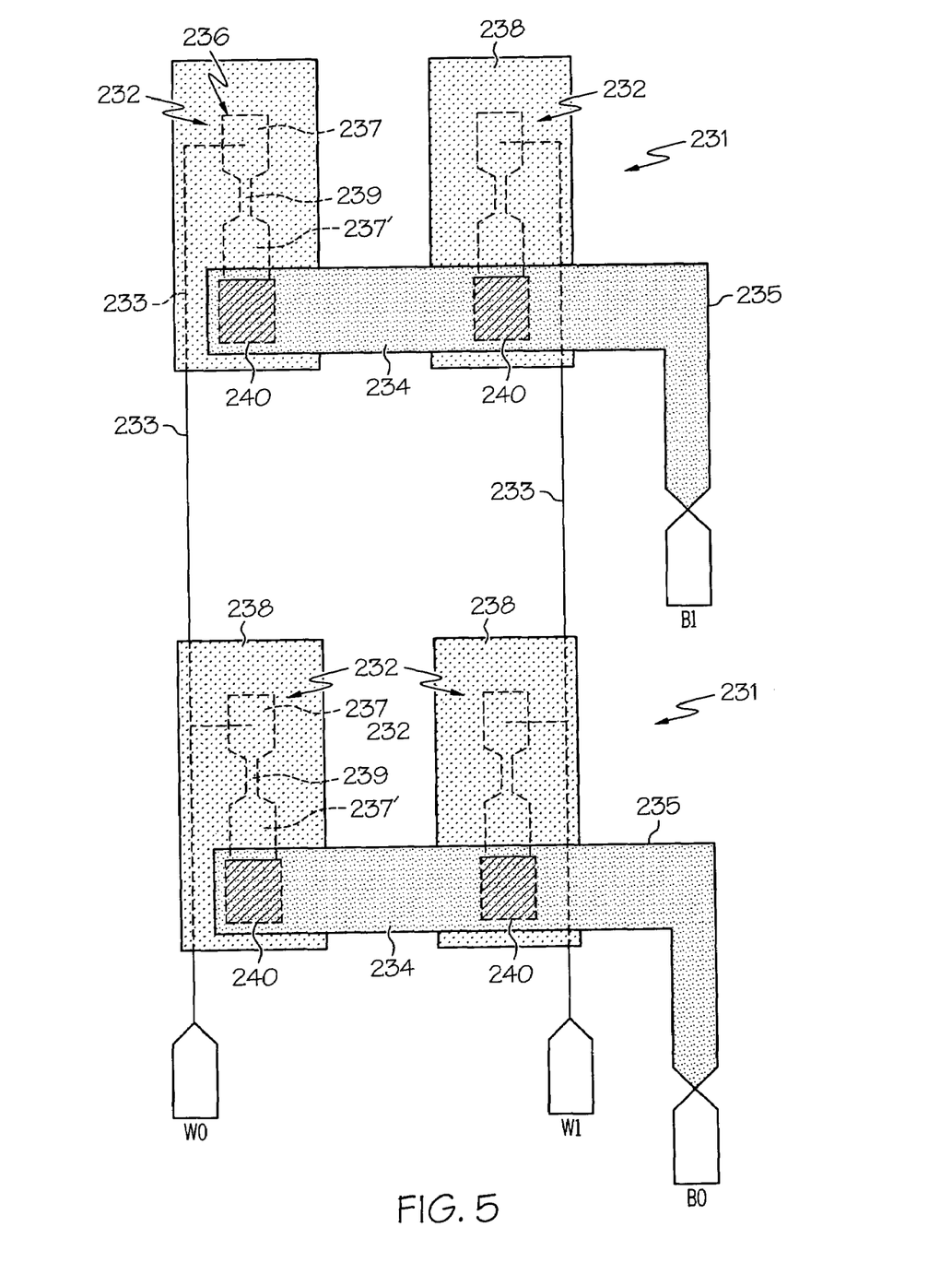
FIG. 5 is a plan view schematic diagram showing an array of fuses printed by a printer in various layers, according to one or more of the inventive principles.

FIG. 5 is a plan view showing an array of fuses printed by a printer in various layers, according to one or more of the inventive principles. In this example, the fuses 232 are printed in corresponding rows 231 and columns. Each fuse 232 includes a first end 237 and the fuses in the same column 236 are connected by the word conductors 233. Each fuse also includes a second end 237' and the fuses in the same row 231 are connected by bit conductors 235. The fuses 232 therefore reside in generally the same plane. A dielectric layer 238 is printed over the majority of each fuse 232, leaving an unprinted open portion 240 for access to the fuse. The bit conductors 235 can then be printed over the dielectric layer 238 and over the open portion 240 in order to connect the fuses in a row 231. Each fuse includes a narrow portion 239 that can serve as a weaker portion that becomes discontinuous in the presence of the predetermined current or voltage differential. The printing of such fuses can be repeated in the XY plane shown in FIG. 5, but also in additional layers in the direction perpendicular to that plane so as to provide a three dimensional array of fuses. Such arrays can be used for memory devices as discussed herein. For example, another plane of fuses 232 can be printed over the dielectric layer 238 since the dielectric will isolate the first plane of fuses electrically from the second plane. Additional dielectric can be applied over the conductors 235 if desired in forming such a three dimensional stacked array.

The foregoing description of various embodiments and principles of the inventions has been presented for the purposes of illustration and description. It is not intended to be exhausted or to limit the inventions to the precise form disclosed. Many alternatives, modifications and variations will be apparent to those skilled in the art. For example, some principles of the invention may be used with different types of printers, fuses, materials, and circuit elements. Moreover, although multiple inventive aspects have been presented, such aspects need not be utilized in combination, and various combinations of inventive aspects are possible in light of the various embodiments provided above. Accordingly, the above description is intended to embrace all possible alternatives, modifications, combinations, and variations that have been discussed or suggested herein, as well as all others that fall within the principles, spirit and broad scope of the inventions as defined by the claims.

What is claimed is:

1. A method of forming a memory element, comprising:
   inkjet printing conductive material to form a fuse element, wherein the inkjet printing operation comprises:
   inkjet printing conductive material at a first dimension to form a main portion;
   inkjet printing conductive material at a second dimension to form a weak portion, the second dimension being less than the first dimension;

wherein the first and second dimensions are configured such that application of a predetermined current through the main portion and weak portion will cause the weak portion to become discontinuous while the main portion remains continuous upon application of the predetermined current.

2. The method as recited in claim 1, further comprising:
ink jet printing a second main portion having a third dimension greater than the second dimension; and
inkjet printing a dielectric layer over the weak portion and main portion of the fuse but not over at least a part of the second main portion.

3. The method as recited in claim 2, further comprising:
inkjet printing a conductive material over the dielectric layer and said part of the second main portion to form an address conductor line, such that the fuse can be written by applying a voltage to the address conductor line.

4. The method as recited in claim 1, wherein the conductive material comprises a single metal material.

5. The method as recited in claim 1, further comprising printing additional layers on the fuse to form an array of addressable fuses, wherein the array is formed on a flexible substrate.

6. A method of forming an array, comprising:
using an inkjet printer to form a first layer comprising conductive material that is configured to act as at least one first fuse, each first fuse having a contact portion;
using an inkjet printer to form a second layer comprising a dielectric material over the first layer, wherein the dielectric material includes an opening that resides over the contact portion of each first fuse;
using an inkjet printer to form a third layer comprising conductive material that is configured to act as a first conductor and is deposited over the dielectric material and the opening and in electrical contact with the contact portion of each first fuse;
using an inkjet printer to form a fourth layer comprising dielectric material and is deposited over the third layer;
using an inkjet printer to form a fifth layer comprising conductive material that is configured to act as at least one second fuse and is applied over the fourth layer, each second fuse having a contact portion;
using an inkjet printer to form a sixth layer comprising dielectric material over the fifth layer, wherein the dielectric material includes an opening that resides over the contact portion of each second fuse; and
using an inkjet printer to form a seventh layer comprising conductive material that is configured to act as a second conductor and is deposited over the sixth layer and the opening and in electrical contact with the contact portion of each second fuse;
wherein the layers form a three dimensional array of fuses.

7. The method as recited in claim 6, wherein each first and second fuse has a first end portion having a first dimension, a second end portion having a second dimension, and a middle portion having a third dimension less than the first and second dimensions, and wherein the first, second and third dimensions are configured such that application of a predetermined current through the end portions and middle portion will cause the middle portion to become discontinuous while the end portions remain continuous upon application of the predetermined current.

8. The method as recited in claim 7, further comprising:
using a printer to form address conductor lines such that the first and second end portions are electrically connected to the address conductor lines.

9. The method as recited in claim 6, wherein the conductive material comprises a single metal material.

10. The method as recited in claim 6 wherein the layers are deposited on a flexible substrate and wherein the printer comprises a thermal inkjet printer having a printhead including a heating element, wherein the printhead is movable relative to the substrate and is configured to deposit droplets of the materials at selective locations along the substrate.

11. A method of forming a fuse device, comprising
using an inkjet printer to deposit a conductive material that is configured to act as a first fuse having a contact portion;
using an inkjet printer to deposit a dielectric material over the first fuse, wherein the dielectric material includes an opening that resides over the contact portion of the first fuse; and
using an inkjet printer to deposit conductive material that is configured to act as a first conductor and is deposited over the dielectric material and the opening and in electrical contact with the contact portion of the first fuse.

12. The method as recited in claim 11, further comprising
using an inkjet printer to deposit conductive material that is configured to act as a second fuse having a contact portion, the second fuse being generally coplanar with the first fuse;
using an inkjet printer to deposit dielectric material over the second fuse, wherein the dielectric material include an opening that resides over the contact portion of the second fuse; and
using an inkjet printer to deposit conductive material that is configured to act as a second conductor and is deposited over the dielectric material and the opening and in electrical contact with the contact portion of the second fuse; and
using an inkjet printer to deposit conductive material that is configured to act as a third conductor and is coplanar with and electrically connecting with at least one of the first and second fuses.

13. The method as recited in claim 12, wherein the first and second conductors are electrically connected and wherein the third conductor electrically connects with the first and second fuses.

14. The method as recited in claim 11,
wherein each fuse has a first end portion having a first dimension, a second end portion having a second dimension, and a middle portion having a third dimension less than the first and second dimensions; and
wherein the first, second and third dimensions are configured such that application of a predetermined current through the end portions and middle portion will cause the middle portion to become discontinuous while the end portions remain continuous upon application of the predetermined current.

15. The method as recited in claim 11, wherein the conductive material comprises a single metal material.

16. The method as recited in claim 11 wherein the materials are deposited on a flexible substrate and wherein the printer comprises a thermal inkjet printer having a printhead including a heating element, wherein the printhead is movable relative to the substrate and is configured to deposit droplets of the materials at selective locations along the substrate.

17. A method of forming an array, comprising:
using an inkjet printer to form a first layer comprising conductive material that is configured to act as at least one first fuse, each first fuse having a contact portion;
using an inkjet printer to form a second layer comprising a dielectric material over the first layer, wherein the dielectric material includes an opening that resides over the contact portion of each first fuse;

using an inkjet printer to form a third layer comprising conductive material that is configured to act as a conductor for connection to a bit line and is deposited over the dielectric material and the opening and in electrical contact with the contact portion of each first fuse;

using an inkjet printer to form a fourth layer comprising dielectric material and is deposited over the third layer, wherein the dielectric material includes an opening that is aligned over the opening of the second layer;

using an inkjet printer to form a fifth layer comprising conductive material that is configured to act as at least one second fuse and is applied over the fourth layer, each second fuse having a contact portion such that the second fuse is in electrical contact with the conductor and the contact portion of each first fuse; and using an inkjet printer to form a sixth layer comprising dielectric material over the fifth layer;

wherein the layers form a three dimensional array of fuses and each vertically adjacent first and second fuse share a bit line through the openings in the second and fourth layers.

* * * * *